United States Patent [19]
Pulsipher et al.

[11] Patent Number: 5,943,446
[45] Date of Patent: Aug. 24, 1999

[54] METHOD AND APPARATUS FOR INCREASING THE SPEED OF A FULL CODE BOOK SEARCH IN A QUANTIZER ENCODER

[75] Inventors: Dennis Carl Pulsipher, Farmington; Robert Vaughn Jones, Bountiful; Roger William Call, Salt Lake City, all of Utah

[73] Assignee: Unisys Corporation, Blue Bell, Pa.

[21] Appl. No.: 08/503,956

[22] Filed: Jul. 19, 1995

[51] Int. Cl.⁶ .................................................. H03M 9/00
[52] U.S. Cl. .......................................... 382/253; 348/422
[58] Field of Search ................................. 348/405, 422, 348/414, 417, 418; 382/253, 106, 251, 166; 358/432; 704/222

[56] References Cited

U.S. PATENT DOCUMENTS

| | | | |
|---|---|---|---|
| 4,903,124 | 2/1990 | Hoshi et al. | 348/422 |
| 5,093,653 | 3/1992 | Ikehira | 345/126 |
| 5,272,529 | 12/1993 | Frederiksen | 348/422 |
| 5,297,170 | 3/1994 | Eyuboglu | 375/242 |
| 5,594,833 | 1/1997 | Miyazawa | 704/221 |
| 5,734,368 | 3/1998 | Meyers et al. | 345/155 |

*Primary Examiner*—Edward L. Coles
*Assistant Examiner*—David Rosenblum
*Attorney, Agent, or Firm*—John B. Sowell; Mark T. Starr; Steven B. Samuels

[57] ABSTRACT

A novel vector quantization encoding system comprises a conventional vector formatter and a novel gross quantizer. The vector formatter generates vectors to be searched in a full code book of vectors. The gross quantizer generates pointers indicative of subsets of vector indices. The vector indices are indicative of groups of vectors to be searched in the full code book that are substantially less in number than the number of vectors in the full code book. A search controller is employed to search only the subset of vectors in the full code book and produce as an output the index of the one vector in the full code book closest to the formatted vector being searched so that the quality of a full code book searched is made faster without degradation of a full code book search.

7 Claims, 9 Drawing Sheets

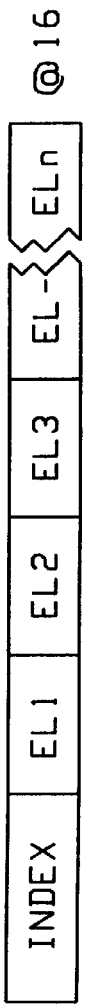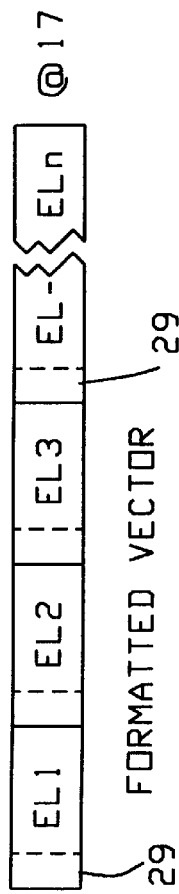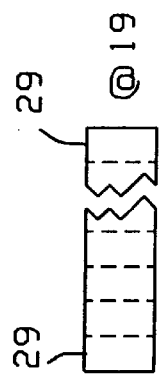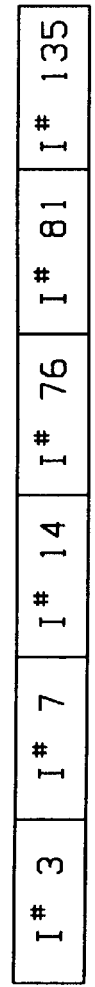
FIG. 2A  FIG. 2B  FIG. 2C  FIG. 2D
FIG. 2

METHOD AND APPARATUS FOR INCREASING THE SPEED OF A FULL CODE BOOK SEARCH IN A QUANTIZER ENCODER

BACKGROUND OF THE INVENTION

1. Field of the Invention

The present invention relates to an apparatus and a method used to compress image data. More particularly, the present invention relates to a method of increasing the speed of performing a full code book search during vector quantization encoding.

2. Description of the Prior Art

Different techniques for vector quantization are known. Some of the methods employed require a full code book search of every vector formatted from the received image. When the number of vectors in the code book become large, and/or the vector elements become rather large or complex, the time required for a full code book search exceeds the ability of the computing system to keep pace with the input image data stream which often exceeds a rate of 10 megabits per second.

It has been suggested that a tree search of coded information would be faster than a full code book search, however, this technique produces degradation or suboptimization with a desirable increase in the speed of encoding.

It has further been suggested that hierarchical encoding could be employed to increase the speed of encoding, however, this technique also degrades the encoded results as well as being difficult to implement.

It would be desirable to be able to obtain the optimum encoded result associated with a full code book search at increased speeds without incurring the cost associated with merely purchasing greater computing power for a faster full code book search.

SUMMARY OF THE INVENTION

It is a principal object of the present invention to provide a new and improved full code book search quantizer encoder.

It is a principal object of the present invention to provide improvements to existing full code book search quantizer encoders that greatly increases the speed of a full code book search.

It is a principal object of the present invention to provide apparatus and a method that substantially lowers the time required to conduct a full code book search in existing or in new quantizer encoders.

It is a principal object of the present invention to provide a method of performing a full code book search of predetermined subsets of vector indices without degrading the encoded results of a vector quantizer.

It is another object of the present invention to provide a method of defining predetermined subsets of vector indices rather than a full set of vector indices for a quantizer encoder.

It is a general object of the present invention to break up an image to be encoded into lattice cells and to define unique optimum sublist of vectors for each of the lattice cells.

It is a general object of the present invention to provide a very fast real time quantizer encoder which performs a full code book search of a subset of the full code book set of vectors for a quantizer encoder.

According to these and other objects of the present invention, there is provided a novel full code book search quantizer encoder which comprises a standard full code book search quantizer and a gross analog to digital quantizer encoder which is adapted to generate pointers indicative of a plurality of cells and a lattice or matrix which embraces the image being encoded. A look up table containing sublists of groups or sets of vector indices is coupled to receive the cell pointer information and to produce as an output indices of groups of vectors in the subsets to be searched the same as a full code book search using only the sublist of vectors. Apparatus for calculating the sublist is coupled to load sublist into the look up table for all of the sublists associated with each of the cells of the lattice which covers a full image being quantized.

BRIEF DESCRIPTION OF THE DRAWINGS

FIG. 2A is a schematic representation of a digital code book vector stored in a code book memory;

FIG. 2B is a schematic representation of a digital vector of the type produced at the output of the vector formatter;

FIG. 2C is a schematic representation of a digital lattice cell address of the type produced at the output of the gross quantizer;

FIG. 2D is a schematic representation of a digital index address pointer comprising an indication of a subset of vectors to be searched in the code book for unique cell addresses;

DESCRIPTION OF A PREFERRED EMBODIMENT

Figure 1:
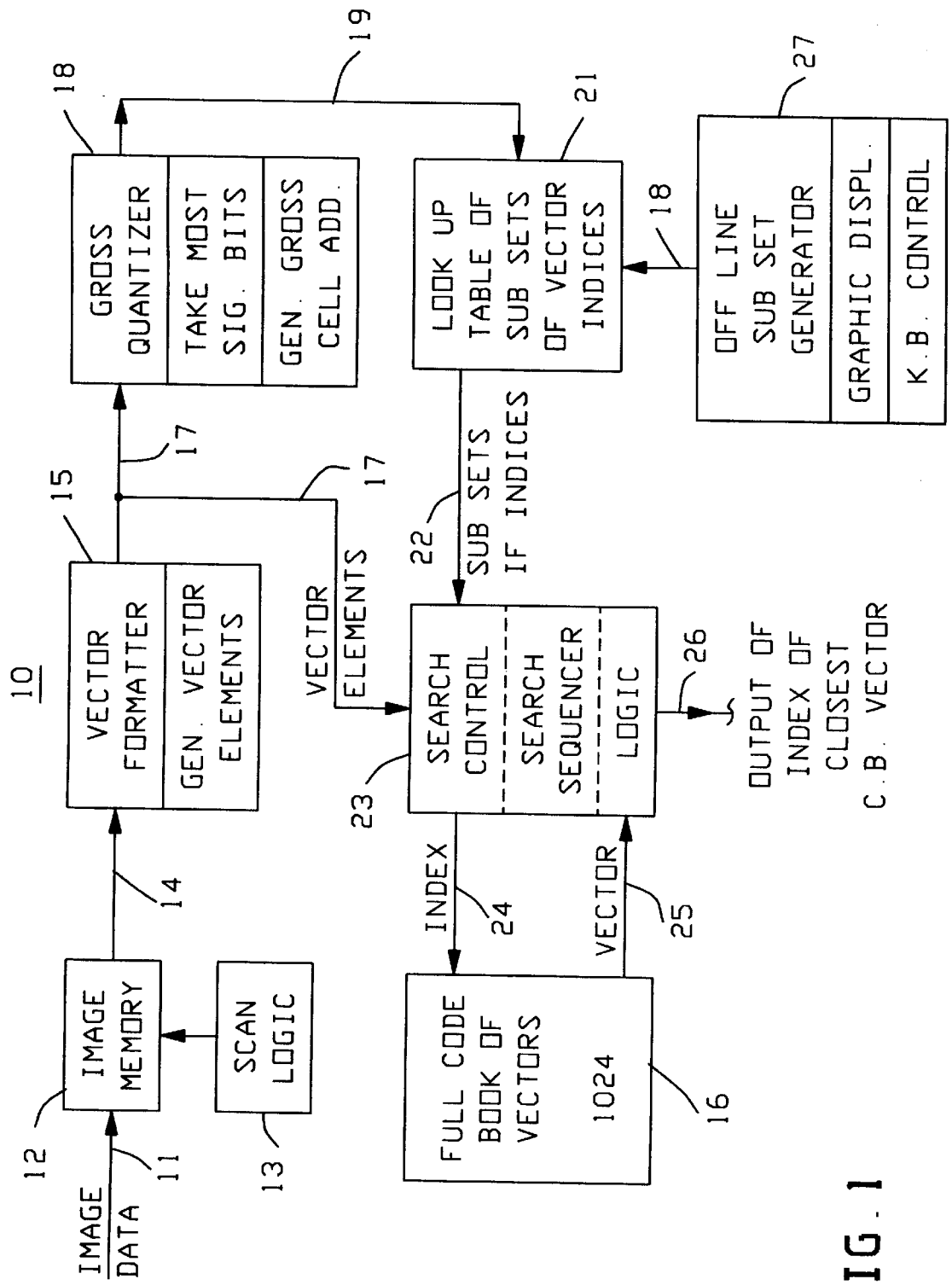
FIG. 1 is a block diagram of a quantizer encoder which includes a preferred embodiment of the present invention modification.

Refer now to FIG. 1 showing a block diagram of the present invention quantizer encoder system 10. Image data in analog and digital form that is digitized on line 11 is stored in an image memory 12 which will be explained hereinafter in the form of a memory map. The image memory 12 serves as a buffer scanned by scan logic 13 to produce binary bits defining pixel data on line 14. The pixel data on line 14 is formatted into vectors in vector formatter 15, preferably into a practical vector format of elements of the types stored in the code book memory 16. The vector elements from vector formatter 15 on line 17 are applied to a novel gross quantizer 18 that takes the most significant bits from the individual elements of a vector on line 17 and generates a gross cell address on line 19 that serves as an address pointer to the look up table 21.

As will be explained in greater detail hereinafter, the look up table 21 contains a plurality of subsets or groups of vector indices each of which is associated with a particular cell that defines a predetermined portion of an image stored in image memory 12, thus, the pointer on line 19 will produce information identifying some of the vectors in the full code book of vector 16.

The subset indices on line 22 defines some, but not all, of the vectors in code book 16 which can be searched for the cell of interest and still produce a full code book search result. For example, if cell 1 of a matrix of 16 cells can be searched by a subset of vectors 1 and 6 in a code book containing a full set of 8 vectors and still produce the. same result as searching all 8 of the vectors in the code book, then the search time will be greatly reduced.

The information on line 22 is a unique subset of vector indices (or vectors) to be searched in the code book 16 and they are changed every time the cell under test changes as will be explained in greater detail hereinafter.

The indices or pointers on line 22 cause the search control 23 to effect a search on line 24 in code book 16 that is constrained to a subset of vectors (indices). Thus, when an indice on line 24 is presented to the code book 16, the code book 16 outputs the vector associated with that index on line 25 to the search control 23 which then performs a comparison and determines which of the subset of vectors pointed to on line 24 is the closest code book vector to the vector being presented on line 17. At the end of the constrained code book search, the search control logic 23 outputs the index of the closest code book vector on line 26 which matches the vector on line 17.

A feature of the present invention is indicated by the off line subset generator 27 which presents information on line 28 to the look up table 21 that describes the subsets or the vector indice groups for each of the cells to be searched in the code book as will be explained in greater detail hereinafter.

Refer now to FIG. 2A showing a schematic representation of a digital code book vector of the type that is stored in code book 16. It will be understood that if there are 1,024 code book vectors, the index is preferably the address of the memory cell. The code book vector of FIG. 2A is an indication of the type and form of information stored in code book 16.

Refer now to FIG. 2B showing a schematic representation of a digital vector of the type produced at the output of the vector formatter 15 on line 17. The formatted vector on lines 17 is in the same format as the code book vector to be searched and has in the individual elements of the vector shown as elements El 1 to El n a plurality of most significant bits 29 of the binary byte shown as the elements 1 through n.

Refer now to FIG. 2C showing a schematic representation of a digital lattice cell address of the type produced at the output of the gross quantizer 18 on line 19. The lattice address or pointer comprises a plurality of most significant bits 29 from the different elements of the formatted vector shown in FIG. 2B. This lattice address pointer is used to identify the cell of the lattice or matrix in which the test is being performed.

Refer now to FIG. 2D showing a schematic representation of a digital index address pointer comprising an indication of the subset of vectors to be searched in the code book for a unique cell address. It will be understood that the subsets on line 22 employ the same format but will either have a header or an end of message appended to the end of the subset which indicates the number of indices in the subset. Thus, the subset illustrated in the FIG. 2D is of the type and form which will be presented on line 24 to the code book to effect an output of individual vectors on line 25 to the search control logic 23.

Figure 3:
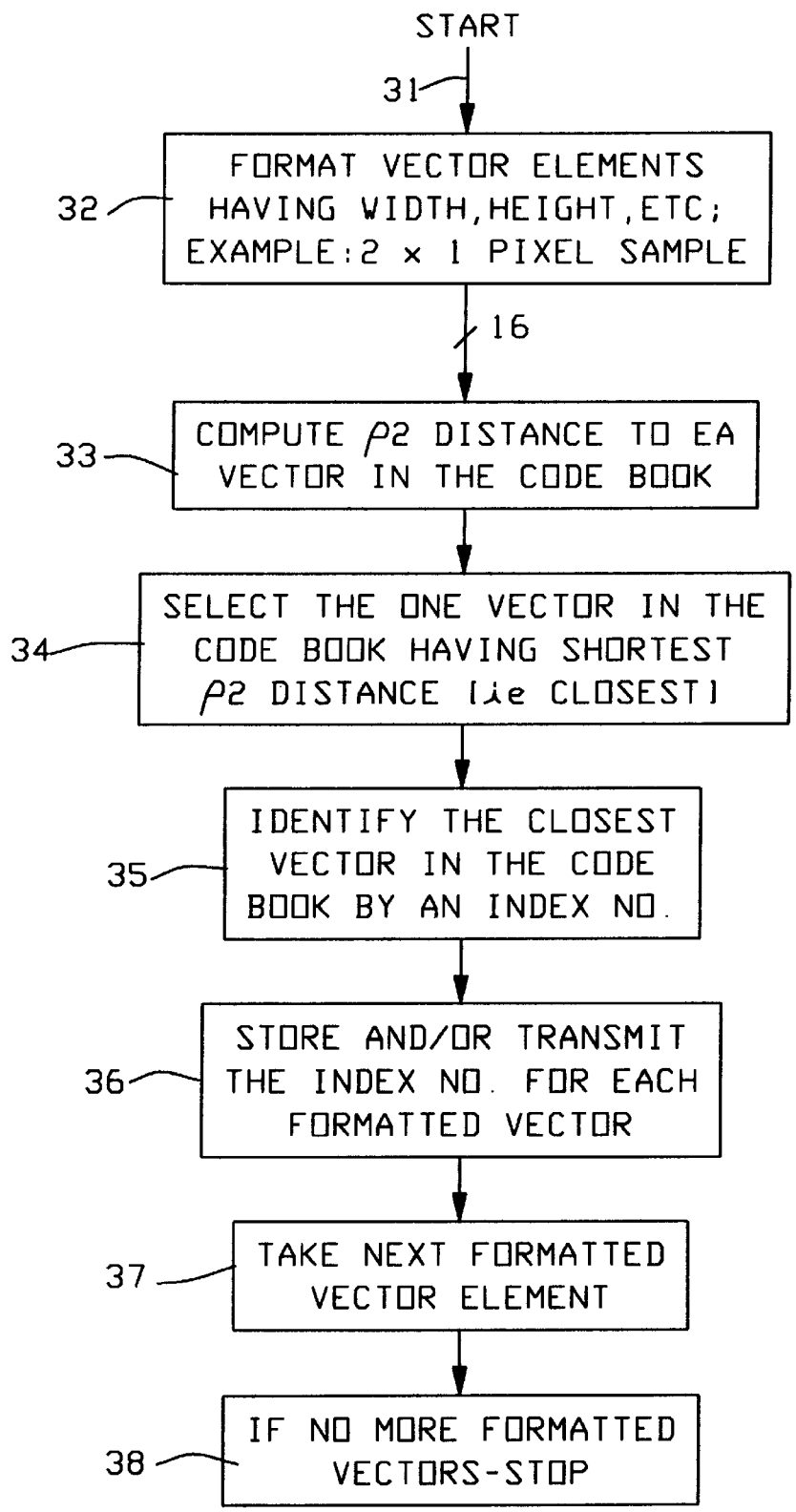
FIG. 3 is a flow diagram showing the principal steps employed in a prior art full code book search.

Refer now FIG. 3 showing a flow chart of the principle steps performed in the prior art when performing a full code book search. In order to illustrate the complexity of a full code book search, first assume that a single vector on line 17 is to be searched in code book 16 of FIG. 1. To start the procedure, the vector element to be searched on line 17 is entered via line 13 into logic block or step 32. In logic block 32 the formatted vector elements on line 17 are entered into the search control 23. The search control then generates an index number on line 24 indicative of the first vector to be searched in the code book. If, for example, the code book has 1024 vectors the procedure to be described hereinafter will be performed 1024 times on the vector on line 17. In logic block 33 the search control 23 computes the Roe square distance ($\rho^2$) to each vector in the code book. To determine the $\rho^2$ or mean square distance, it is necessary for the search control logic to subtract the difference between each element of each vector and square the results and maintain them in the memory of the search control. This value is referred to as the roe square distance or Roe square separation between vectors. After computing the Roe square distance for all vectors in the code book, it is then necessary to select the one vector in the code book that has the shortest or smallest Roe square distance indicative of the vector which is closest to the vector being searched on line 17. In step 35 the closest vector is identified by the index number associated with the vector in the code book. In block 36 the index of the closest vector may be stored or immediately transmitted via line 26 to a utilization device. After performing the search in the code book of a first vector on line 17, it is now necessary to take the next vector on line 17 as illustrated in block 37 and repeat the process and search for the next closest vector to the vector element being searched. When there are no more vector elements defining the image in memory 12, then the search control 23 recognizes the end of message and no more formatted vectors will be presented as shown in block 38 and the process ends. It will now be appreciated that it is necessary to perform one add operation and one multiplier operation for each vector in the code book multiplied by the number of elements in the vector on line 17. Thus, when the number of elements in a vector is in the order of 64 elements and the number of vectors in the code book is of the order of 1,000 vectors the number of computations to achieve a continuous real time operation of image data becomes mind boggling and has not been feasible heretofore. Employing the present invention, it is now possible to perform real time processing of image data being received at speeds exceeding 10 megabits per second.

Figure 4:
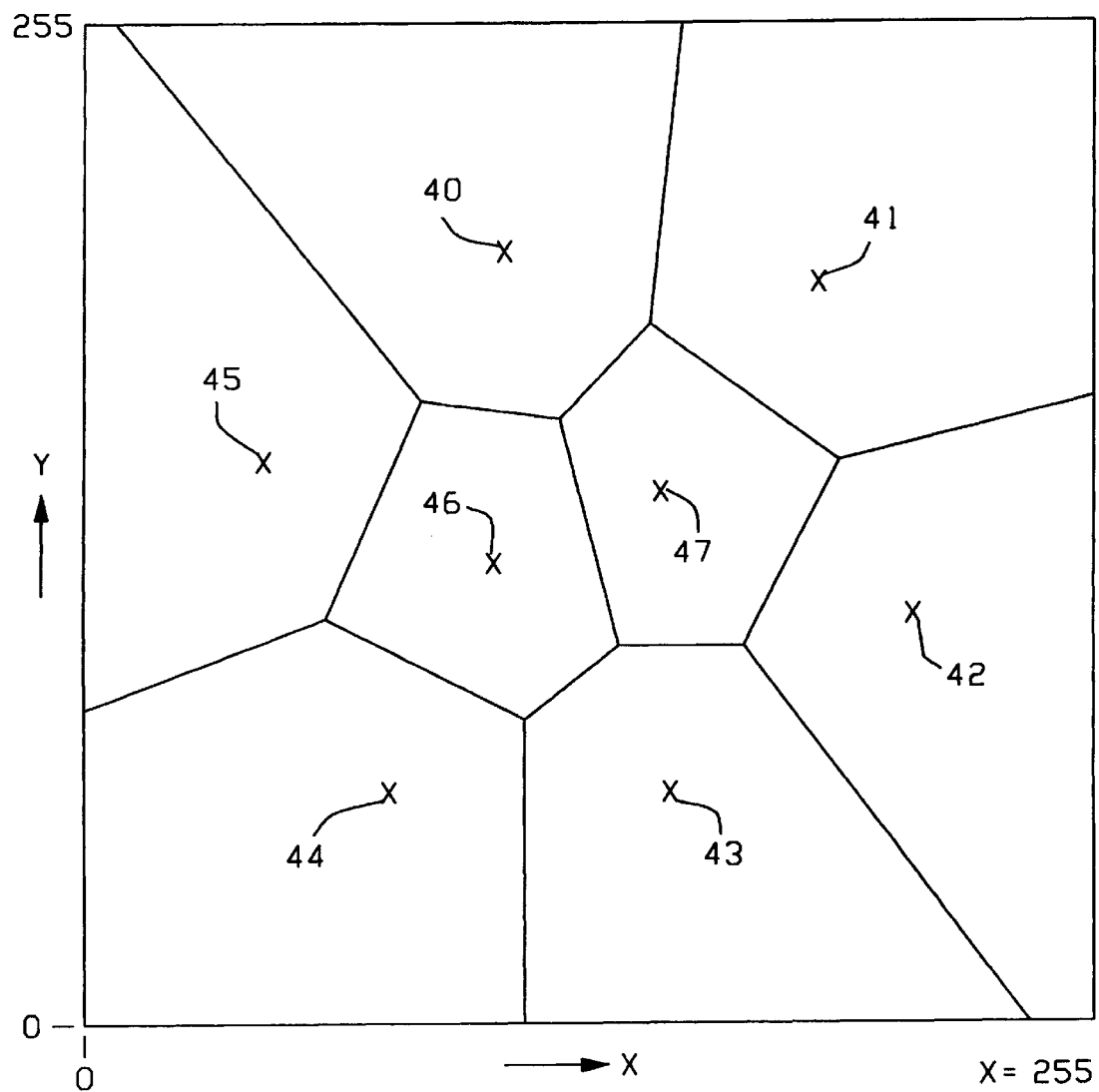
FIG. 4 is two-dimensional image diagram demonstrating the location of code book vectors and the boundaries between vector regions which are also known as Voronoi regions.

Refer now to FIG. 4 showing a two-dimensional image diagram demonstrating the location of code book vectors and the boundary between vector regions known as Voronoi regions.

Assume for the purposes of illustration of the present invention that the vectors in code book 16 can be defined as two-dimensional vectors. Thus, the two-dimensional vectors will have X and Y orders of magnitude as illustrated in FIG. 4. When the vector dimensions or values of magnitude are plotted onto a rectangular coordinate, the marks shown at points 40 through 47 will represent eight vectors having XY magnitude that are stored in a full code book of vectors similar to code book 16. When these vectors are plotted on the rectangular coordinate of FIG. 4, there will appear boundaries half way between each of the adjacent vectors which will define regions known as Voronoi regions. Every point within these regions is closest to the vector inside of its boundary or stated differently, a point inside the region is closer to the vector in the region than any other vector in the code book. Thus, the analogy is that if a search is made in any one of the regions, the closest vector will be the vector inside of that Voronio region.

Figure 5:
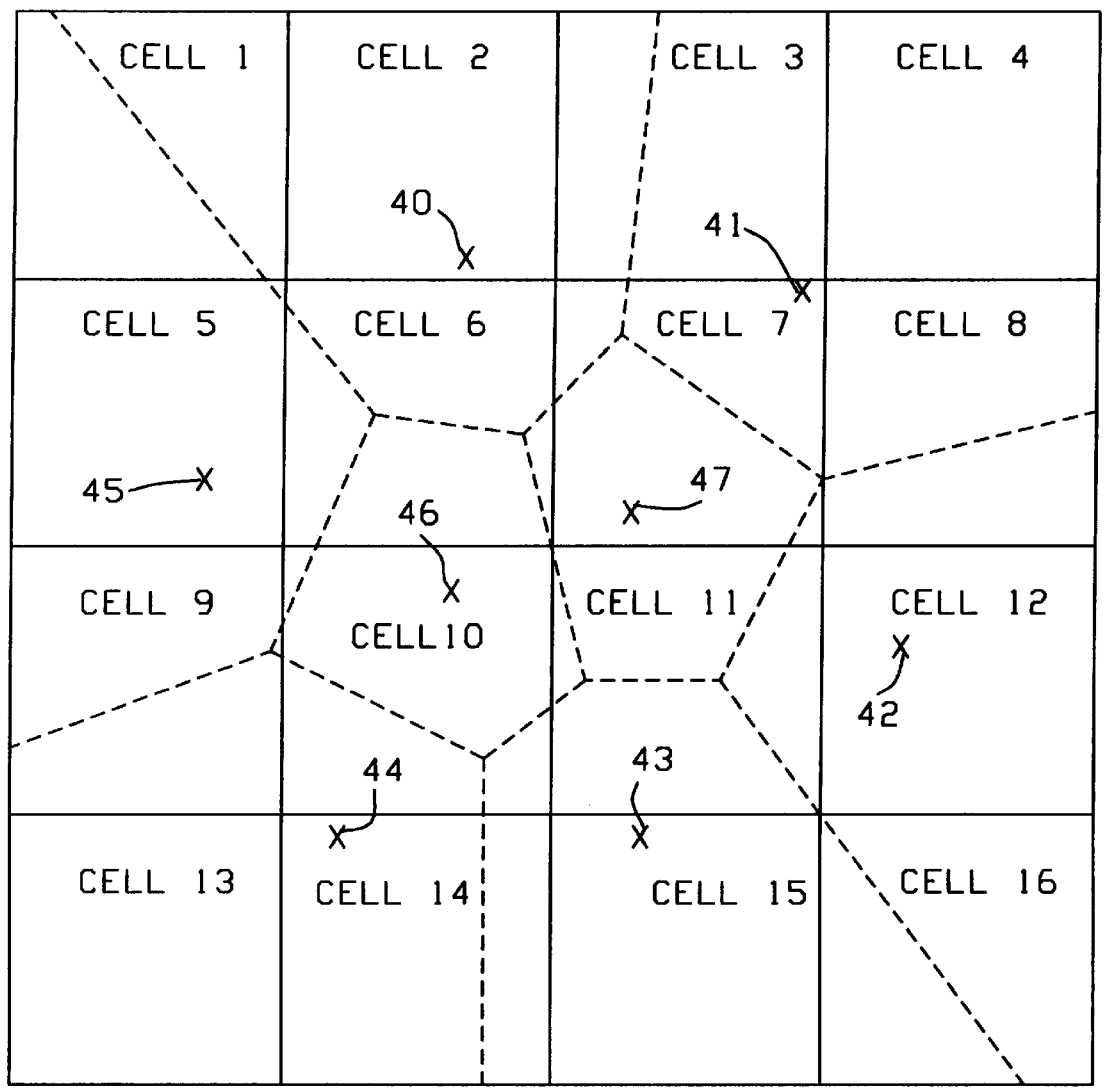
FIG. 5 is a lattice overlay diagram to be used with the image diagram of FIG. 4 to explain the present invention.

Refer now to FIG. 5 showing a lattice of cells which will be used as an overlay for the image of FIG. 4. To more clearly describe the present invention, the regions of FIG. 4 have been superimposed on FIG. 5 as phantom lines. The image of FIG. 4 and FIG. 5 has been divided into a rectangular matrix of 16 cells. The cells are numbered from left to right and from top to bottom in a logical sequence for presentation only. It will be observed that at cell 1 the boundary between vectors 40 and 45 extends through cell 1 and it will be shown that when the vectors in the cell 1 region are searched that it is only necessary to search code book vectors 40 and 45. Similarly, at cell 3 only the boundary between vectors 40 and 41 is present and that it is only necessary to search vectors 40 and 41 when searching any image vector in cell 3. The search becomes more complex when searching cell 6 which has boundaries associated with vectors 40, 47, 45 and 46. Thus, when searching cell 6 it will be necessary to create a sublist of vectors including 45, 46, 47 and 40. When the cell 9 is under test or being searched, the vectors for cell 9 have a boundary from vector 46 that only slightly encroaches into cell 9. When the test is made for cell 9, vectors 44 and 45 alone may be searched and the vector associated with vector 46 may be eliminated in the subset. Since the generation of subsets of indices are performed or generated off line and not in real time, it is possible to fine tune or eliminate vectors which have little effect on the output or result and to further increase the speed of computation.

Figure 6:
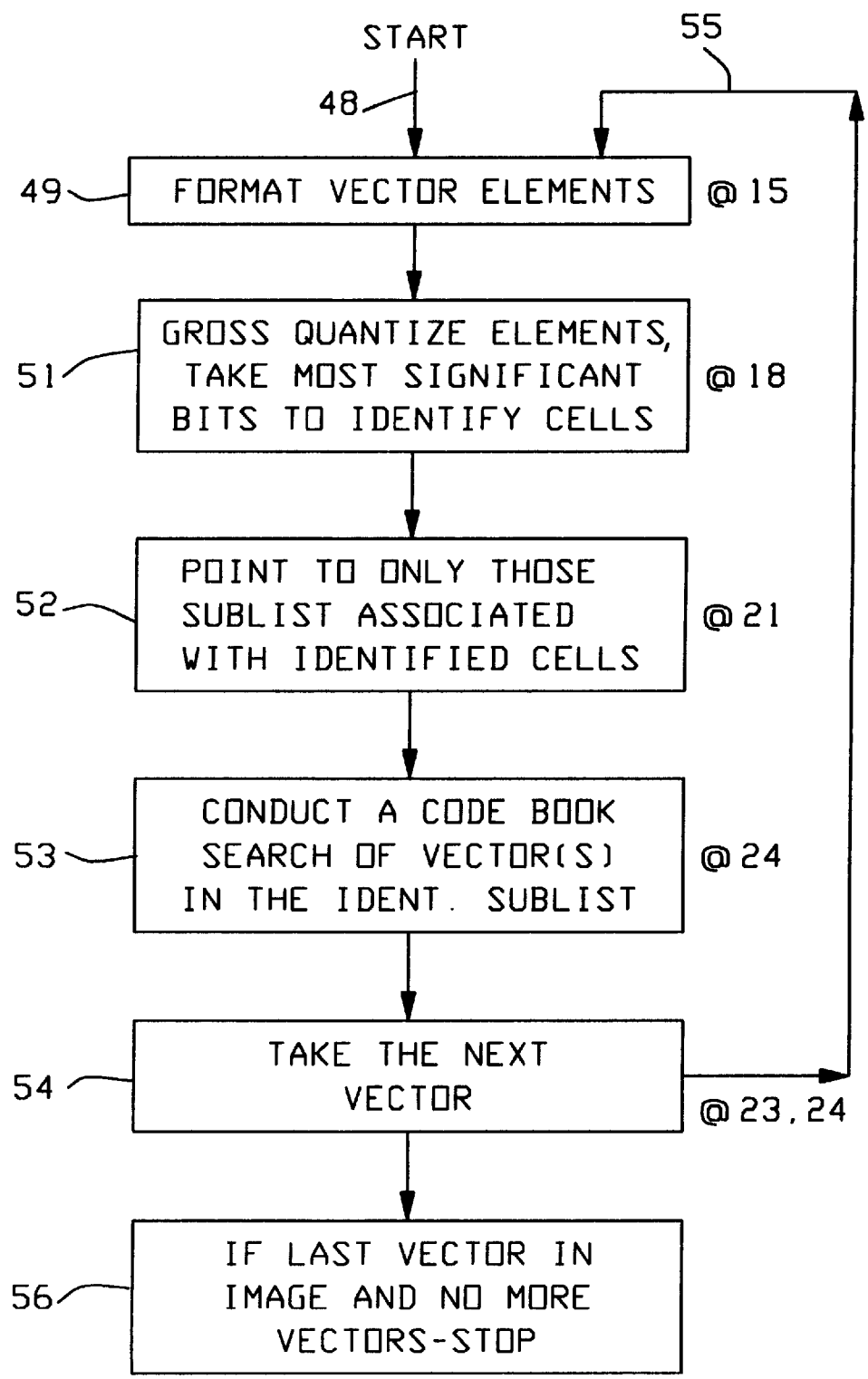
FIG. 6 is a flow chart showing a high level overview of the new and modified steps performed in the vector encoder of FIG. 1.

Refer now to FIG. 6 showing a flow diagram of a high level overview of the new and improved steps performed in the high speed vector encoder of FIG. 1. The method of performing a fast quantized encoding starts at point 48 of FIG. 6. In the vector formatter 15, the step 49 formats the vector elements. Each vector element so formatted is quantized at gross quantizer 18 by taking the most significant bits to identify the cells under test as illustrated by block 51. Next the output of gross quantizer on line 19 points to only those sublists associated with the identified cells as shown at block 52. The pointer on line 19 effects a signal on line 24 as shown at block 53 so as to perform a code book search of the vectors indicated on line 24 which are identified on the sublist. This code book search outputs some of the vectors in the code book 16 via line 25 and performs the search in search control 23 which identifies the closest vector. After the closest vector is identified, the next vector on line 17 is brought into the search control 23 as indicated at line 54. The same sequence of steps is performed as shown in FIG. 6 until the last vector of the image is brought into the search control 23 as shown at block 56 and the process of searching and outputting the index of the closest vector on line 25 is terminated.

Figure 7:
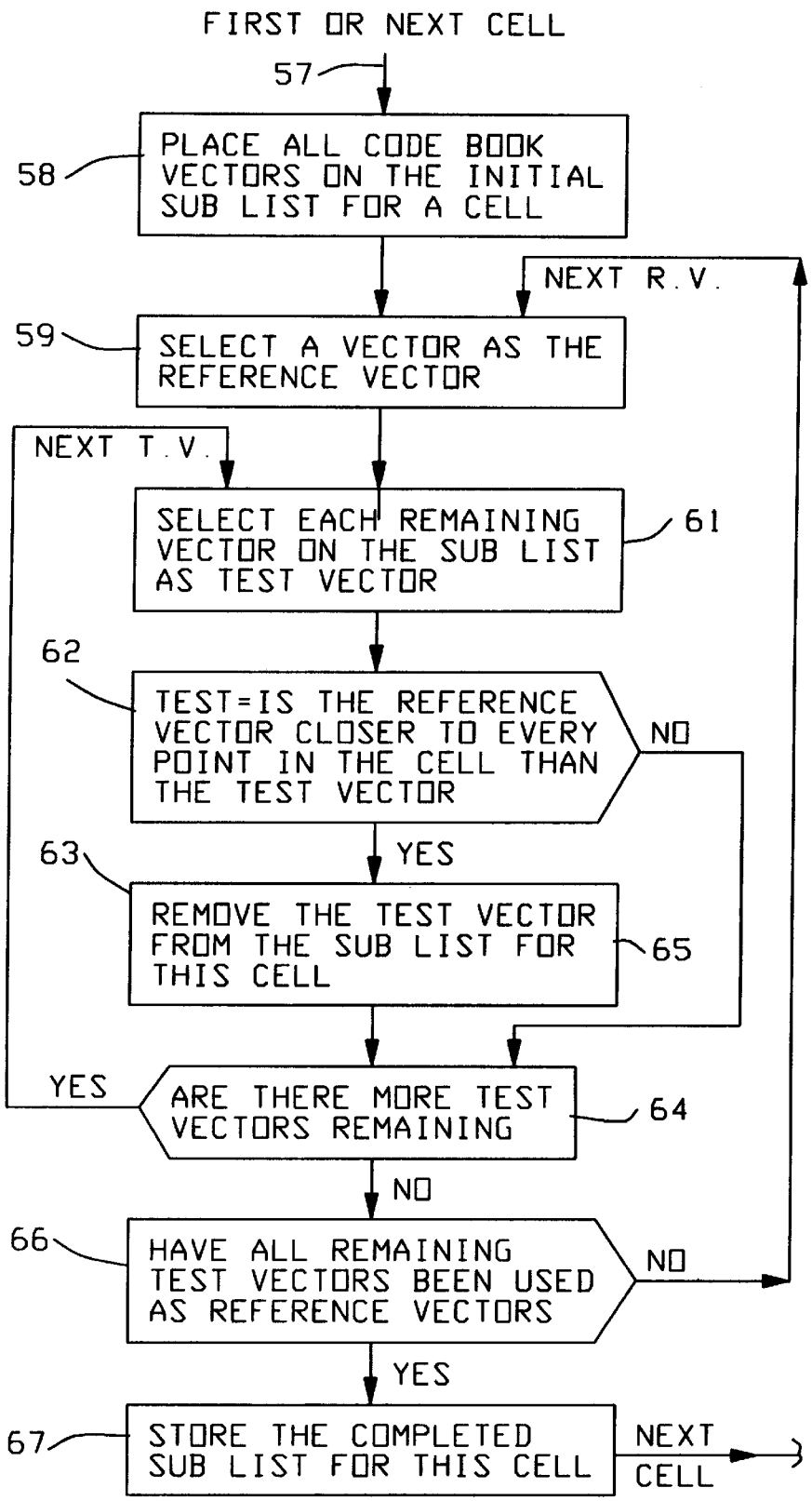
FIG. 7 is a more detailed flow chart showing the novel steps performed to generate the sublists for individual cells of the lattice diagram shown in FIG. 5.

Refer now to FIG. 7 which is a more detailed flow chart of the novel steps that are performed in the off line subset generator 27 of FIG. 1 to generate the sublist for individual cells of the lattice shown in FIG. 5. As was explained in FIG. 5, it is obvious which vectors to elect for the sublist when the number of cells and the number of regions is very small. However, when the number of regions and vectors becomes very large an algorithm or test is performed which will accomplish the same results with a large number of vectors and cells. Refer now to the start line 57 and the first block 58 at FIG. 7. In order to generate a complex sublist, first place all of the vectors that will be in the full code book in a sublist for each individual cell under test. After starting with a full code book of vectors select one of the vectors as a reference vector, as shown in block 59. As shown in block 61, then treat each of the remaining vectors in the sublist not including the reference vector as a test vector on the sublist. As shown in block 61 perform the following test: if the reference vector so chosen is closer to every point in the cell under test than the test vector, then remove the test vector from the sublist of the cell as shown in block 63. However, if this is not true then leave the test vector in the sublist and bypass block 63 and proceed to block 64 via line 65. In block 64 determine if there are any more test vectors remaining to perform the above test. If the answer is yes, then start with the reference vector and another test vector and perform the same operation performed in blocks 62 through 64. Stated differently, the reference vector is tested against every test vector in the sublist and once a test vector is eliminated it is no longer on the sublist. When all of the test vectors are compared in the test block 62, then another of the vectors on the sublist must be treated as a reference vector and the same sequence of operations started all over. In block 66, when the reference vector has been tested against all of its test vectors, all remaining test vectors have been used as reference vectors. After this is performed, the operation indicated in block 67 stores the completed sublist for this cell. The next cell will be tested in a similar manner. If the test performed in block 66 indicates that all of the remaining test vectors have not been treated as a reference, then the next reference vector must be generated and selected as shown in block 59 and the test performed on the remaining test vectors in the sublist.

Having explained the rules and concepts of generating sublists applicable to two dimensional images with reference to FIGS. 4 and 7, it will be appreciated that the same rules may be applied to extend to three dimensions. However, when the axes extend beyond three spatial dimensions, it is now necessary to generate the aforementioned sublist with a more sophisticated set of rules.

Figure 8:
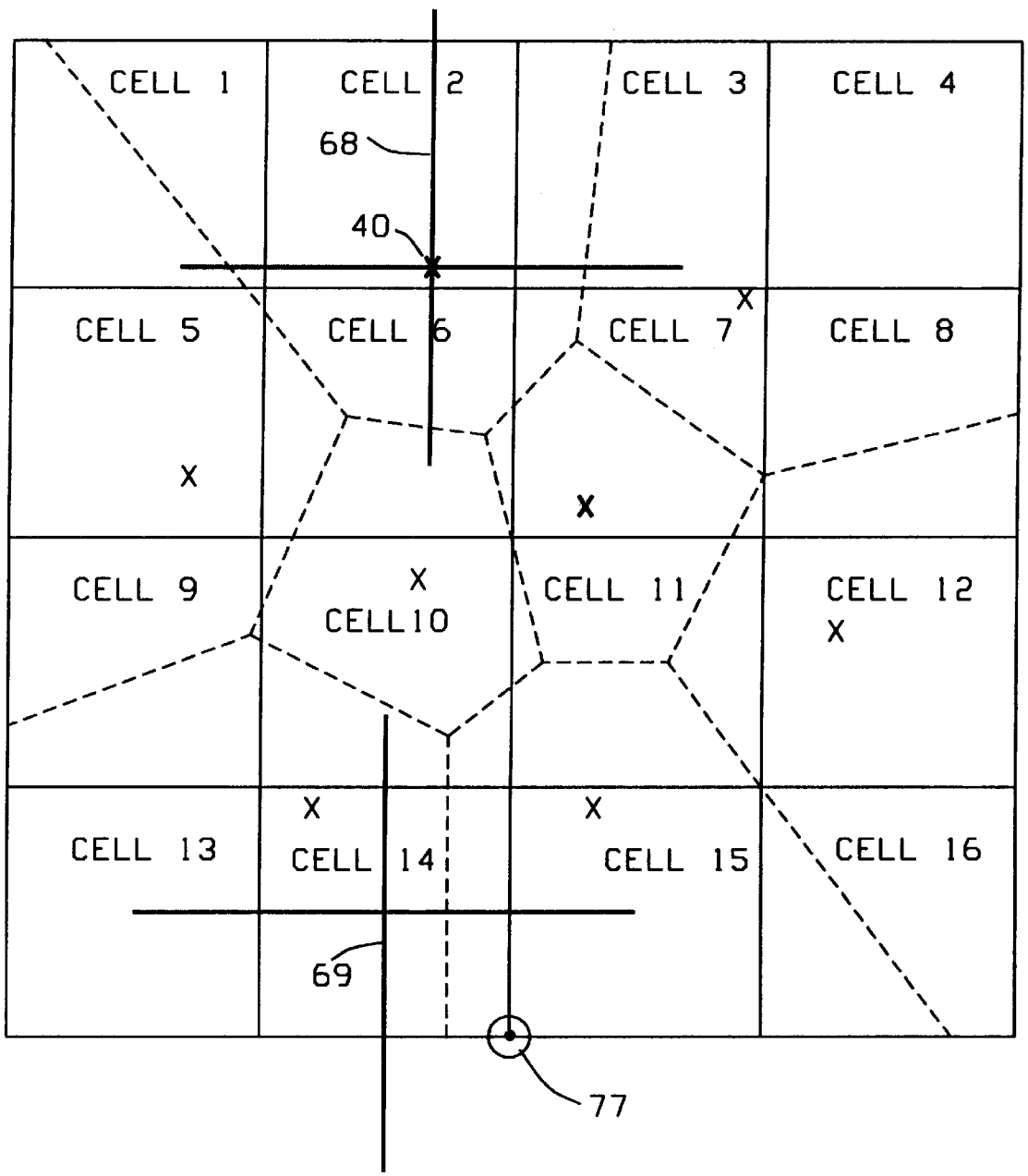
FIG. 8 is another lattice overlay diagram showing the placement of two four-axes coordinate systems for implementation of a simple method of determining sublists for individual cells of the lattice shown in FIG. 5.
Figure 9:
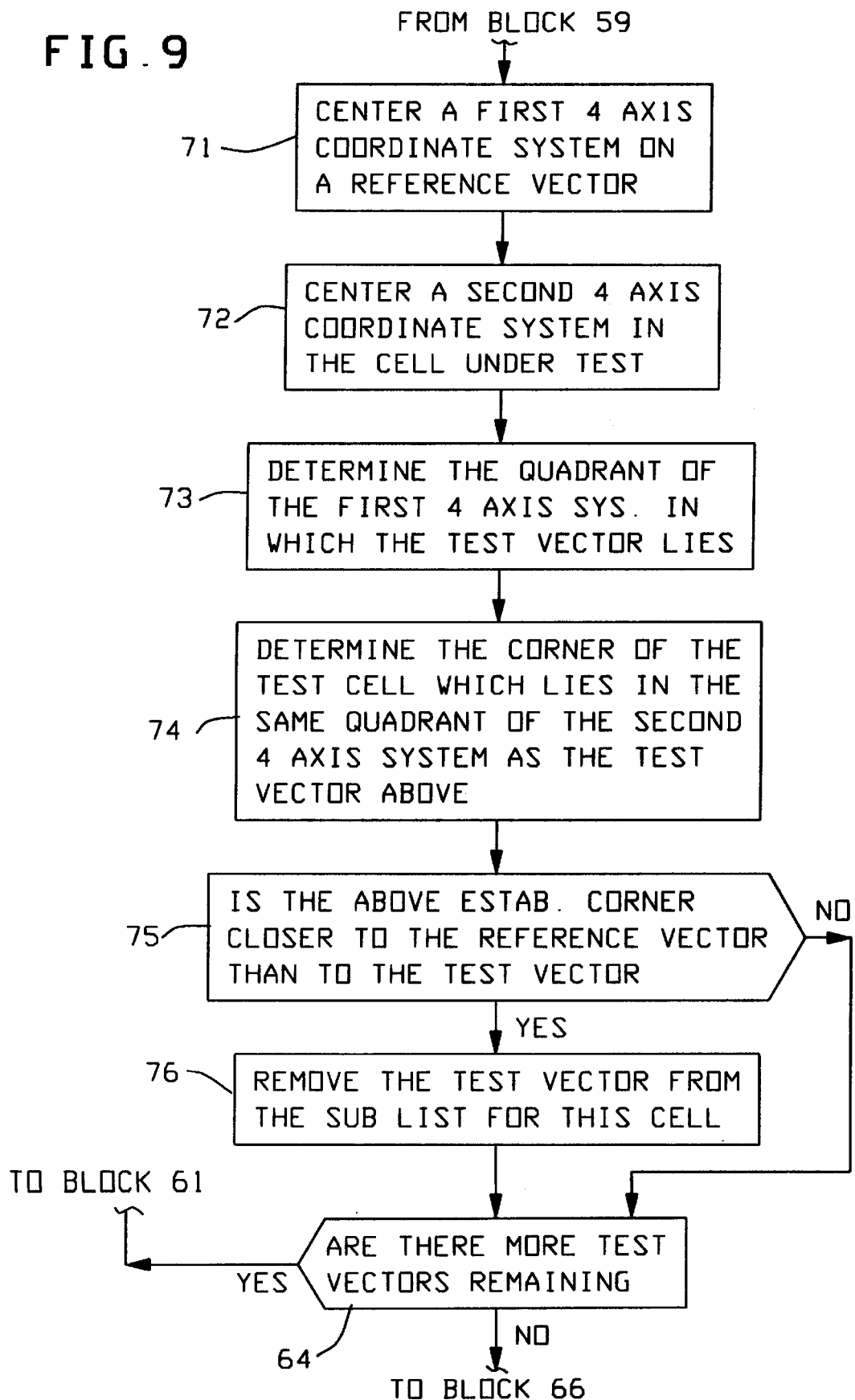
FIG. 9 is a more detailed flow chart showing a modification to the flow chart of FIG. 7 which is used to implement the method of generating the sublists for the cells shown in FIG. 8.

Refer now to FIG. 8 showing another lattice overlay diagram and a placement of two four axes coordinate systems 68 and 69. A four coordinate systems 68 is placed at the exact center of vector 40 and a four coordinate system 69 is placed at the exact center of cell 14. In order to follow the new set of rules, envision the four coordinate system 68 as having four conventional quadrants numbering 1 through 4 counterclockwise about the vector 40. Similarly, number the quadrants around the center of four coordinate system 69 into four similar quadrants. Now perform the identical test that was performed in FIG. 7 to generate the sublist by substituting blocks 71 through 76 in FIG. 9 for blocks 61 through 63 of FIG. 7 as will now be explained. In the start of the operation using the FIG. 8 diagram, the first block 71 shows that the four axis coordinate system 68 is centered on vector 40. Next in block 72 a second coordinate system 69 is centered in the cell 14 under test. In the next step of the operation, the subset generator 27 must determine the quadrant of the first four axis system in which the test vector lies. In this illustration employ the test vector 47 which lies in the fourth quadrant of the coordinate system number 68. When this determination is made in block 73, it is now necessary to determine the corner 77 of the cell 14 which lies in the same quadrant of the four axis system 68 as the test vector 47. This corner is corner 77 of cell 14. Having made this determination in block 74, it is now necessary to establish whether the corner 77 is closer to the reference vector 40 than to the test vector 47. Since the answer is NO, then we will bypass the block 76 and we will not remove the test vector from the sublist for this cell. Had the test been different as will occur when other reference vectors and test vectors are compared in the operation shown in FIG. 9, some of the test vectors will fall out and there will only be left a list of remaining vectors which will be stored in the subset generator 27 and subsequently stored in the look up table 21. Having explained how the flow diagram of FIG. 9 is used to modify the flow diagram of FIG. 7, it will be appreciated that the flow diagram of FIG. 9 is applicable to a four axis system as illustrated in FIG. 8. Having explained a simple two-dimensional example of a four axis system, it will now be appreciated that the same rules and concepts may be applied to higher dimensional axes systems employing the rules of higher level mathematics.

Digital imagery is becoming more common for military, scientific, and commercial uses. Such imagery may be electro-optical, infrared, multi-spectral, or synthetic aperture array information. For this imagery to be available in real time from a satellite or remote station such as an airborne platform, the bandwidth of the data link system must be wide enough to accommodate the amount of imagery information which the system can process to a down link system. Real time data compression is a vital technology for effectively increasing the bandwidth utilization of the above mentioned systems. The system explained in the foregoing specification is particularly applicable for the commercial and military uses noted where large amounts of data may be compressed in real time employing the results achieved with a full code book search in a vector quantizing system.

What is claimed is:

1. A vector quantization encoding system for searching vectors in a full code book of vectors and for generating an index value indicative of the closest vector found in the code book, comprising:

said code book containing a full set of vectors that could be searched, said vectors comprising an index number associated with a group of vector elements defining such vector in the code book, a vector formatter for receiving image data at an input and generating at an output a vector to be searched, said vector to be searched being defined by a group of vector elements, search control means coupled to the output of the said vector formatter for receiving information defining the vector to be searched in said code book, a gross quantizer coupled to the output of said vector formatter for generating a gross lattice address at an output, look up table means coupled to the output of said gross quantizer for generating at an output a subset of vector indices indicative of one or more of the vectors stored in said code book corresponding to a gross lattice address, said look up table means further including means for generating said subset of vector indices coupled to said look up table, said means for generating said subset of vector indices further comprising means for representing said vectors in said code book in a two dimensional coordinate array of vectors separated by Voronoi boundaries that includes a matrix which divides said array of vectors into a plurality of cells, and said search control means having a second input coupled to the output of said look up table for constraining a full code book search to only those vectors in said code book corresponding to a subset of vector indices received from said look up table and corresponding to a gross lattice address.

2. A vector quantization system as set forth in claim 1 wherein said means for generating said subset of vector indices comprises an off line computing system for generating a matrix of cells.

3. A vector quantization system as set forth in claim 2 wherein said means for generating said subsets of vector indices comprises a manual input keyboard.

4. A vector quantization system as set forth in claim 2 wherein the means for generating said matrix of cells further includes a computer programmable to automatically generate a subset of vector indices for each cell which excludes all vectors in said code book that are not required to produce the same result as a full code book search of all vectors in said code book.

5. A vector quantization system as set forth in claim 2 wherein the means for generating said matrix of cells further includes means for performing a predetermined series of program steps in a computer to define a subset of vector indices for each cell which restricts said search control means to search a constrained subset of vectors in said code book that contain the code book vector closest to the formatted vector being searched.

6. A vector quantization system as set forth in claim 1 wherein said means for generating said subset of vector indices further includes:

means for placing all code book vectors on a sublist, means for selecting a reference vector from said sublist of code book vectors, means for selecting a test vector from one of the remaining code book vectors on said sublist, means for testing whether the reference vector is closer to every point in the cell under test than the test vector, and means for removing all test vectors from said sublist that are further from every point in the cell under test than the reference vector.

7. A vector quantization system as set forth in claim 6 which comprises making each remaining vector on said sublist a reference vector and all remaining vectors on said sublist test vectors and repeating the test performed by said means for testing.

* * * * *